United States Patent
Abe et al.

(10) Patent No.: US 9,124,135 B2
(45) Date of Patent: Sep. 1, 2015

(54) SYSTEM FOR CONTROL OF WIND POWER GENERATION STORAGE BATTERY AND METHOD OF CONTROL THEREOF

(75) Inventors: Keiko Abe, Mito (JP); Masahiro Watanabe, Hitachi (JP); Yasuhiro Kobayashi, Hitachinaka (JP); Toshiyuki Furukawa, Hitachi (JP); Hisaaki Takabayashi, Nabari (JP); Yoshikazu Hirose, Matsudo (JP)

(73) Assignee: SHIN-KOBE ELECTRIC MACHINERY CO., LTD., Tokyo (JP)

( * ) Notice: Subject to any disclaimer, the term of this patent is extended or adjusted under 35 U.S.C. 154(b) by 559 days.

(21) Appl. No.: 13/059,919

(22) PCT Filed: Jan. 6, 2010

(86) PCT No.: PCT/JP2010/000042
§ 371 (c)(1),
(2), (4) Date: Jul. 29, 2011

(87) PCT Pub. No.: WO2010/079745
PCT Pub. Date: Jul. 15, 2010

(65) Prior Publication Data
US 2011/0288691 A1    Nov. 24, 2011

(30) Foreign Application Priority Data
Jan. 7, 2009    (JP) ................. 2009-001345

(51) Int. Cl.
*G05D 3/12*    (2006.01)
*G06F 7/00*    (2006.01)
(Continued)

(52) U.S. Cl.
CPC ... *H02J 3/32* (2013.01); *F03D 7/00* (2013.01); *F03D 9/021* (2013.01); *H01M 10/46* (2013.01);
(Continued)

(58) Field of Classification Search
CPC ..... H01M 10/48; H01M 10/46; H01M 10/44; Y02E 40/72; Y02E 60/12; B60L 11/1857; B60L 11/1859
USPC ............... 700/8, 36, 48, 49, 50, 90, 286, 291; 60/39.12, 39.13; 706/19, 21, 907; 705/412
See application file for complete search history.

(56) References Cited

U.S. PATENT DOCUMENTS 6,037,751 A * 3/2000 Klang ............................ 320/160
2007/0001680 A1* 1/2007 Khoo ............................ 324/430
(Continued)

FOREIGN PATENT DOCUMENTS

CN   201 122 851 Y   9/2008
CN   101415578      4/2009
(Continued)

OTHER PUBLICATIONS

Wang et al. Determination of Battery Storage Capacity in Energy Buffer for Wind Farm, 2008.*
(Continued)

*Primary Examiner* — Darrin Dunn
(74) *Attorney, Agent, or Firm* — Fitch, Even, Tabin and Flannery LLP

(57) ABSTRACT

While a control method is established which can maximize the lifetime of an storage battery based on a SOC capable of maximizing the lifetime of the storage battery under a temperature condition and a wind condition at an electricity generation site and on currently known ones of other operational conditions, a control system is constructed which can feedback to an actual wind power generation and storage battery system. The control system includes a wind power generation and storage battery system, an storage battery operation and deterioration data collection unit for collecting data of the wind power generation and storage battery system, an storage battery operation and deterioration relation assessment unit for assessing a relation between an operation of the storage battery and deterioration thereof based on the collected data, an storage battery operation planning unit for planning such a method of operating the storage battery as to satisfy a necessary lifetime requirement using information obtained by the storage battery operation and deterioration relation assessment unit, and an storage battery operation instruction unit for instructing the wind power generation and storage battery system to operate the storage battery in accordance with the plan of the storage battery operation planning unit.

12 Claims, 14 Drawing Sheets

(51) Int. Cl.

| | | |
|---|---|---|
| *F02B 43/00* | (2006.01) | |
| *G06E 1/00* | (2006.01) | |
| *G01R 11/56* | (2006.01) | |
| *H02J 3/32* | (2006.01) | |
| *F03D 7/00* | (2006.01) | |
| *F03D 9/02* | (2006.01) | |
| *H01M 10/46* | (2006.01) | |
| *H01M 10/48* | (2006.01) | |
| *H02J 7/00* | (2006.01) | |

(52) U.S. Cl.
CPC ............. *H01M 10/48* (2013.01); *H02J 7/0075* (2013.01); *Y02E 10/723* (2013.01); *Y02E 10/766* (2013.01); *Y02E 70/30* (2013.01)

(56) References Cited

U.S. PATENT DOCUMENTS

| | | | |
|---|---|---|---|
| 2007/0029974 A1 | 2/2007 | Uchida | |
| 2008/0114499 A1* | 5/2008 | Hakim et al. | 700/291 |
| 2009/0027056 A1* | 1/2009 | Huang et al. | 324/439 |
| 2009/0040033 A1 | 2/2009 | Uchida | |
| 2009/0228225 A1* | 9/2009 | Burgess | 702/63 |
| 2012/0059527 A1* | 3/2012 | Beaston et al. | 700/295 |

FOREIGN PATENT DOCUMENTS

| | | |
|---|---|---|
| CN | 101496255 | 7/2009 |
| DE | 102006000397 | 2/2007 |
| EP | 1 968 151 A2 | 9/2008 |
| EP | 2048763 | 4/2009 |
| JP | 08-222279 | 8/1996 |
| JP | 09-115554 | 5/1997 |
| JP | 202-027679 | 1/2002 |
| JP | 2002-027679 | 1/2002 |
| JP | 2003-250227 | 9/2003 |
| JP | 2004-079914 | 3/2004 |
| JP | 2004-186087 | 7/2004 |
| JP | 2005-143218 | 6/2005 |
| JP | 2006-100000 | 4/2006 |
| JP | 2006-313127 | 11/2006 |
| JP | 2007-074891 | 3/2007 |
| JP | 2007-274806 | 10/2007 |
| JP | 2008-042960 | 2/2008 |
| WO | WO2007/114410 | 10/2007 |
| WO | WO2008/016129 | 2/2008 |

OTHER PUBLICATIONS

Rong, An Analytical Model for Predicting the Remaining Battery Capacity of Lithium-Ion Batteries, 2005.*
European Search Report dated Jan. 27, 2014 for European Application No. EP 10 72 9165.

* cited by examiner

FIG. 11

| LEVEL | CONTROL FACTORS | | | | | | | |
|---|---|---|---|---|---|---|---|---|
| | a | b | c | d | e | f | g | h |
| | EQUAL CHARGING INTERVAL | SOC USE RANGE (CENTER VALUE) | SOC USE RANGE (WIDTH) | CHARGE-DISCHARGE CYCLE (HIGH FREQUENCY) | CHARGE-DISCHARGE CYCLE (LOW FREQUENCY) | CHARGING /DISCHARGING CURRENT | TEMPERATURE | CHARGING EFFICIENCY |
| 1 | EVERY TWO WEEKS | 45% | 40% | 10 SECONDS | 1 HOUR | 0.1CA | 5°C | 97% |
| 2 | EVERY MONTH | 55% | 50% | 1 MINUTE | 6 HOURS | 0.3CA | 25°C | 98% |
| 3 | ✕ | 65% | 60% | 20 MINUTES | 24 HOURS | 0.4CA | 45°C | 99% |

FIG. 12

| EXPERIMENT NO | CONTROL FACTORS | | | | | | | |
|---|---|---|---|---|---|---|---|---|
| | a | b | c | d | e | f | g | h |
| 1 | 1 | 1 | 1 | 1 | 1 | 1 | 1 | 1 |
| 2 | 1 | 1 | 2 | 2 | 2 | 2 | 2 | 2 |
| 3 | 1 | 1 | 3 | 3 | 3 | 3 | 3 | 3 |
| 4 | 1 | 2 | 1 | 1 | 2 | 2 | 3 | 3 |
| 5 | 1 | 2 | 2 | 2 | 3 | 3 | 1 | 1 |
| 6 | 1 | 2 | 3 | 3 | 1 | 1 | 2 | 2 |
| 7 | 1 | 3 | 1 | 2 | 1 | 3 | 2 | 3 |
| 8 | 1 | 3 | 2 | 3 | 2 | 1 | 3 | 1 |
| 9 | 1 | 3 | 3 | 1 | 3 | 2 | 1 | 2 |
| 10 | 2 | 1 | 1 | 3 | 3 | 2 | 2 | 1 |
| 11 | 2 | 1 | 2 | 1 | 1 | 3 | 3 | 2 |
| 12 | 2 | 1 | 3 | 2 | 2 | 1 | 1 | 3 |
| 13 | 2 | 2 | 1 | 2 | 3 | 1 | 3 | 2 |
| 14 | 2 | 2 | 2 | 3 | 1 | 2 | 1 | 3 |
| 15 | 2 | 2 | 3 | 1 | 2 | 3 | 2 | 1 |
| 16 | 2 | 3 | 1 | 3 | 2 | 3 | 1 | 2 |
| 17 | 2 | 3 | 2 | 1 | 3 | 1 | 2 | 3 |
| 18 | 2 | 3 | 3 | 2 | 1 | 2 | 3 | 1 |

FIG. 13

| INPUT SCREEN OF "LIFETIME PREDICTION TOOL" (EXAMPLE) |
|---|

●SELECT CONTROLLABLE CONDITION  ●PREDICT LIFETIME (a) EQUAL CHARGING INTERVAL ▼
    (a1) EVERY TWO WEEKS
(b)   (a2) EVERY MONTH

[PREDICT LIFETIME]

●DETERMINE DETERIORATION OF EACH PORTION

[POSITIVE PLATE CORROSION] [SULFATION] [STRATIFICATION]

(c) SOC USE RANGE (WIDTH) ▼

(d) CHARGE-DISCHARGE TIME (SHORT CYCLE) ▼

(e) CHARGE-DISCHARGE TIME (LONG CYCLE) ▼

●PREDICT "CAPACITY/DETERIORATION DEGREE" FROM "YEARS OF USE"

AFTER ~ YEARS OF USE (f) CHARGING/DISCHARGING CURRENT ▼

[PREDICT STORAGE BATTERY CAPACITY]

(g) TEMPERATURE ▼

[POSITIVE PLATE CORROSION] [SULFATION] [STRATIFICATION]

(h) CHARGING EFFICIENCY ▼

SYSTEM FOR CONTROL OF WIND POWER GENERATION STORAGE BATTERY AND METHOD OF CONTROL THEREOF

TECHNICAL FIELD

The present invention relates to a control system for increasing the lifetime of an storage battery for suppressing fluctuations in wind power generation in a wind power generation system, and a method of control thereof. The present invention also relates to an optimum operation of the wind power generation system which minimizes the cost of the system including the storage battery and maximizes profit from wind power generation.

BACKGROUND ART

Global warming is a serious problem to all human beings and, in each of the countries in the world, to retard and stop the progress of global warming, energy saving, the use of new energy which does not emit $CO_2$, and the like have been promoted.

In Japan also, to reduce $CO_2$ emissions, the government determines the goal of new energy introduction, and promotes the introduction of electricity generation using new energy such as solar power, wind power, or the like, while also giving subsidy or the like.

Wind power generation using natural energy has the advantage of no emission of $CO_2$, but an electricity output generated thereby is not stable, resulting in concerns about adverse effect on an electric power system and the deterioration of electric power quality. For the purpose of preventing such an adverse effect on an electric power system, when wind power generation is introduced, it is widely performed to simultaneously introduce an storage battery system.

FIG. 18 shows an example of an storage battery system for controlling output fluctuations in a wind power generation system. An electricity output generated by wind power generation significantly varies depending on wind conditions. If allowed to flow without any alteration, the generated electricity output exerts an adverse effect on the electric power quality of an electric power system. To prevent this, with an storage battery system using an storage battery such as a lead acid storage battery, a lithium ion battery, a super capacitor, or the like, an storage battery system output in accordance with the state of a wind power generated electricity output is produced. As a result, a wind power generated electricity output and the storage battery system output are combined to allow a smoothed system output to flow to the electric power system, and enable avoidance of the adverse effect on the electric power quality.

FIG. 19 shows an example of a requirement of interconnected system of wind power generation in an electric power company. In the example of the drawing, fluctuations in an combined output of wind power generation and the storage battery are restricted such that the difference between the maximum and minimum values of a 1-minute averaged value in 20 minutes is suppressed to be not more than 10% of a rated output of wind power, and it is requested to satisfy such a requirement of interconnected system.

It is known that the lifetime of an storage battery greatly differs depending on an operational condition. Using an storage battery for suppressing fluctuations in an output of wind power generation is a relatively new attempt. Therefore, at present, it is not entirely clear how a controllable one of operational conditions for the storage battery should be used for the operation thereof to be able to maximize the lifetime of the storage battery, while satisfying the requirement of system integration of wind power generation. Unlike in an application of conventional industrial load leveling (electric power is accumulated at night, and discharged during daytime when a load is large), in a wind power generation storage battery system, it is assumed that short-time charging and discharging are repeated in a PSOC (Parcial State of Charge) that is not a full-charged state. Even under such an unprecedented operational condition, an operation is needed which suppresses the deterioration of the storage battery, and increases the lifetime thereof to a level equal to or longer than the life cycle of a wind power generator.

Concerning a control method of the state of charge (SOC) of a lead acid storage battery, Patent Document 1 is laid open. This method is for measuring the number of times that falls within the lower limit range of SOC upon charging/discharging of the lead acid storage battery, and raising a SOC level in accordance therewith.

Concerning the maintenance of storage battery equipment, Patent Document 2 is laid open. It is disclosed therein that, when the maintenance of the storage battery equipment is performed, the capacity of each of storage batterys is checked through short-time discharging and, by replacing only the storage battery with capacity shortage, cost for storage battery replacement is reduced.

PRIOR ART DOCUMENTS

Patent Documents

Patent Document 1: Japanese Unexamined Patent Publication No. 2004-186087

Patent Document 2: Japanese Unexamined Patent Publication No. 2006-100000

SUMMARY OF INVENTION

Problems to be Solved by Invention

The method of Patent Document 1 cannot be implemented in the wind power generation system in which it has not been established what kind of SOC control is to be performed. In addition, the lifetime of the storage battery is influenced not only by SOC, but also by various other related operational conditions. However, in the method of Patent Document 1, no consideration is given to a general control method including operational conditions other than SOC.

At present, a SOC capable of maximizing the lifetime of the storage battery under a temperature condition and a wind condition at an electricity generation site and all the other operational conditions have not been found. However, to stop the progress of global warming, it cannot be allowed to wait for the establishment of all technologies, and then introduce wind power generation and an storage battery system for wind power generation. It is therefore a first task to be achieved by the present invention to construct a system which assesses a control method capable of maximizing the lifetime of an storage battery, and feedbacks the result thereof to an actual wind power generation system.

A second task to be achieved is how to profit from an entire wind power generation and storage battery system including an storage battery. In other words, constructing an electricity generation system capable of maximizing profit by generally considering profit from wind power generation, cost associated with interconnected system, the cost of the storage battery, and the like is the task to be achieved. In future, the purchase price of wind power generated electric power may vary depending on the quality of the electric power. The purchase price may also vary depending on whether or not the wind power generation system has succeeded in generating electricity in an exactly announced amount. In such a case also, it is required to construct an electricity generation system capable of maximizing profit by balancing income and cost.

Means for Solving the Problems

To attain the foregoing objects, the present invention is characterized by being provided with: a wind power generation and storage battery system having an storage battery; an storage battery operation and deterioration data collection unit for collecting data of the storage battery in the wind power generation and storage battery system; an storage battery operation and deterioration relation assessment unit for assessing a relation between an operation of the storage battery and a lifetime and deterioration thereof based on the data collected by the storage battery operation and deterioration data collection unit; an storage battery operation planning unit for planning a method of operating the storage battery which satisfies a necessary lifetime requirement based on information obtained by the storage battery operation and deterioration relation assessment unit; and an storage battery operation instruction unit for instructing the operation of the storage battery in the wind power generation and storage battery system in accordance with the plan of the storage battery operation planning unit.

The present invention is also characterized by being provided with: a wind power generation and storage battery system having an storage battery; an storage battery operation and deterioration data collection unit for collecting data of the storage battery in the wind power generation and storage battery system; an storage battery operation and deterioration relation assessment unit for assessing a relation between an operation of the storage battery and a lifetime and deterioration thereof based on the data collected by the storage battery operation and deterioration data collection unit; an storage battery cost assessment unit for assessing information on cost of the storage battery; an electric power company penalty cost assessment unit for assessing cost including interconnected system penalty cost paid to an electric power company and a profit from wind power generation; an storage battery operation planning unit for planning a cost optimum method of operating the storage battery based on information obtained by the storage battery operation and deterioration relation assessment unit, the storage battery cost information, and electric power company cost information; and an storage battery operation instruction unit for instructing the operation of the storage battery in the wind power generation and storage battery system in accordance with the plan of the storage battery operation planning unit.

A method of controlling a system for control of a wind power generation storage battery including a wind power generation and storage battery system, an storage battery operation and deterioration data collection unit for collecting data of the wind power generation and storage battery system, an storage battery operation and deterioration relation assessment unit for assessing a relation between an operation of an storage battery and a deterioration thereof based on the data collected by the storage battery operation and deterioration data collection unit, an storage battery operation planning unit for planning a method of operating the storage battery which satisfies a necessary lifetime requirement using information obtained by the storage battery operation and deterioration relation assessment unit, and an storage battery operation instruction unit for instructing the wind power generation and storage battery system to operate the storage battery in accordance with the plan of the storage battery operation planning unit, the method being characterized by including the step of: when the relation between the operation of the storage battery and the deterioration thereof is assessed, and the operation of the storage battery that satisfies the necessary lifetime requirement is planned, determining a degree of influence of an operational condition for the storage battery on an storage battery lifetime and a deteriorated portion using a Taguchi method (dynamic characteristic) to assess a relation between the operational condition and the storage battery lifetime and deteriorated portion.

A method of controlling a system for control of a wind power generation storage battery including a wind power generation and storage battery system having an storage battery, an storage battery operation and deterioration data collection unit for collecting data of the storage battery in the wind power generation and storage battery system, an storage battery operation and deterioration relation assessment unit for assessing a relation between an operation of the storage battery and a deterioration thereof based on the data collected by the storage battery operation and deterioration data collection unit, an storage battery cost assessment unit for assessing information on cost of the storage battery, an electric power company cost assessment unit for assessing cost including interconnected system penalty cost paid to an electric power company and a profit from wind power generation, an storage battery operation planning unit for planning a cost optimum method of operating the storage battery based on information obtained by the storage battery operation and deterioration relation assessment unit, the storage battery cost information, and electric power company cost information, and an storage battery operation instruction unit for instructing the operation of the storage battery in the wind power generation and storage battery system in accordance with the plan of the storage battery operation planning unit, the method being characterized by including the step of: when the relation between the operation of the storage battery and the deterioration thereof is assessed, and the operation of the storage battery that satisfies a necessary lifetime requirement is planned, determining a degree of influence of an operational condition for the storage battery on an storage battery lifetime and a deteriorated portion using a Taguchi method (dynamic characteristic) to assess a relation between the operational condition and the storage battery lifetime and deteriorated portion.

Effects of Invention

According to the present invention, under natural conditions such as a wind power condition, a temperature condition, and the like each peculiar to an electricity generation site where a wind power generation and storage battery system is placed, control of the wind power generation and storage battery system can be optimized as necessary so as to be capable of maintaining the lifetime of the storage battery till the targeted years.

In addition, control of the wind power generation and storage battery system can be performed as necessary such that total cost including profit from electric power generated using natural energy, the cost of the wind power generation and storage battery system including a maintenance expense, and cost paid to an electric power company is optimized (profit maximization).

BRIEF DESCRIPTION OF THE DRAWINGS

[FIG. 11] An illustrative view showing control factors in an L18 experiment plan.

[FIG. 12] An illustrative view showing the L18 experiment plan (orthogonal array table).

[FIG. 13] A schematic diagram showing a screen of a lifetime prediction tool according to the Taguchi method.

DESCRIPTION OF EMBODIMENTS

Figure 1:
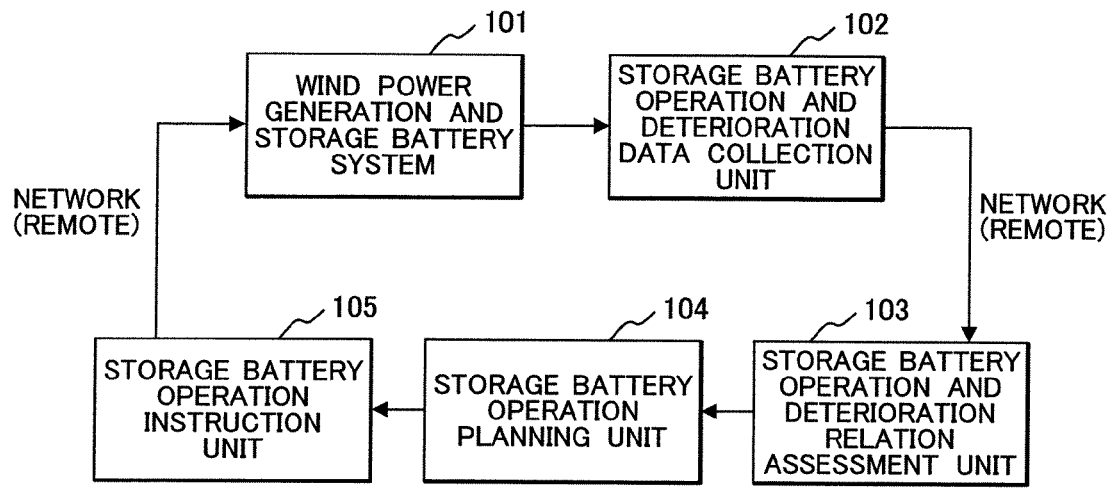
[FIG. 1] A functional block diagram showing Embodiment 1 of the present invention.

Using the drawings, embodiments of the present invention when a lead acid storage battery is used as an storage battery will be described hereinbelow in detail.
[Embodiment 1]
FIG. 1 shows a functional block diagram of Embodiment 1. The functional block of the present invention is comprised of a wind power generation and storage battery system 101 and an storage battery operation and deterioration data collection unit 102 which are provided at an electricity generation site, and an storage battery operation and deterioration relation assessment unit 103, an storage battery operation planning unit 104 for satisfying a lifetime requirement required of a lead acid storage battery, and an storage battery operation instruction unit 105 which are provided at a remote control site.

Figure 2:
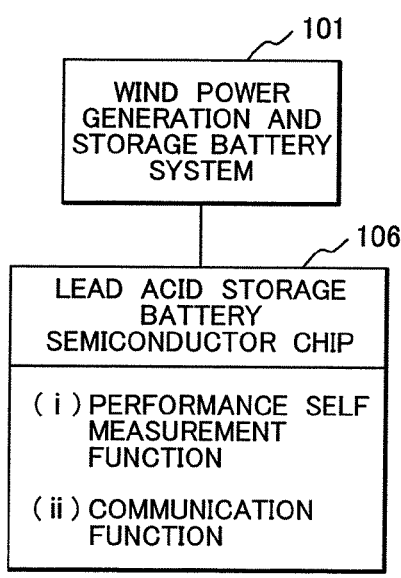
[FIG. 2] A schematic diagram showing storage battery data collection using a semiconductor chip.

The operation of Embodiment 1 will be described below. The wind power generation and storage battery system 101 has a wind power generation device, and a control device for controlling the lead acid storage battery that levels an output thereof. The storage battery operation and deterioration data collection unit 102 is typically provided in the control device of the wind power generation and storage battery system to collect the operation data and deterioration data of the lead acid storage battery in the wind power generation and storage battery system 101. The data collected by the storage battery operation and deterioration data collection unit 102 is transmitted via a network to the storage battery operation and deterioration relation assessment unit 103 at the remote control site. The collection of the storage battery operation and deterioration data may also be performed using a semiconductor chip 106 mounted in the storage battery in the wind power generation and storage battery system 101 as shown in FIG. 2.

The storage battery operation and deterioration relation assessment unit 103 assesses the relation between the operation of the lead acid storage battery and the lifetime and deterioration thereof based on the collected data of the lead acid storage battery. Then, the storage battery operation planning unit 104 plans an operation method (control method) of the lead acid storage battery based on information on the relation between the operation and deterioration of the lead acid storage battery determined by the storage battery operation and deterioration relation assessment unit 103 such that the lead acid storage battery satisfies the necessary lifetime requirement.

Based on the operation plan produced by the storage battery operation planning unit 104, the storage battery operation instruction unit 105 transmits instruction information on the operation of the lead acid storage battery via the network to the wind power generation and storage battery system 101 and, based thereon, the control device of the wind power generation and storage battery system 101 performs proper operation and control of the lead acid storage battery.

The storage battery operation and deterioration relation assessment unit 103, the storage battery operation planning unit 104, and the storage battery operation instruction unit 105 are constructed on a lifetime prediction tool, which is a software program operating on a host computer at the remote control site.

(Storage Battery Operation and Deterioration Data Collection Unit)

Figure 3:
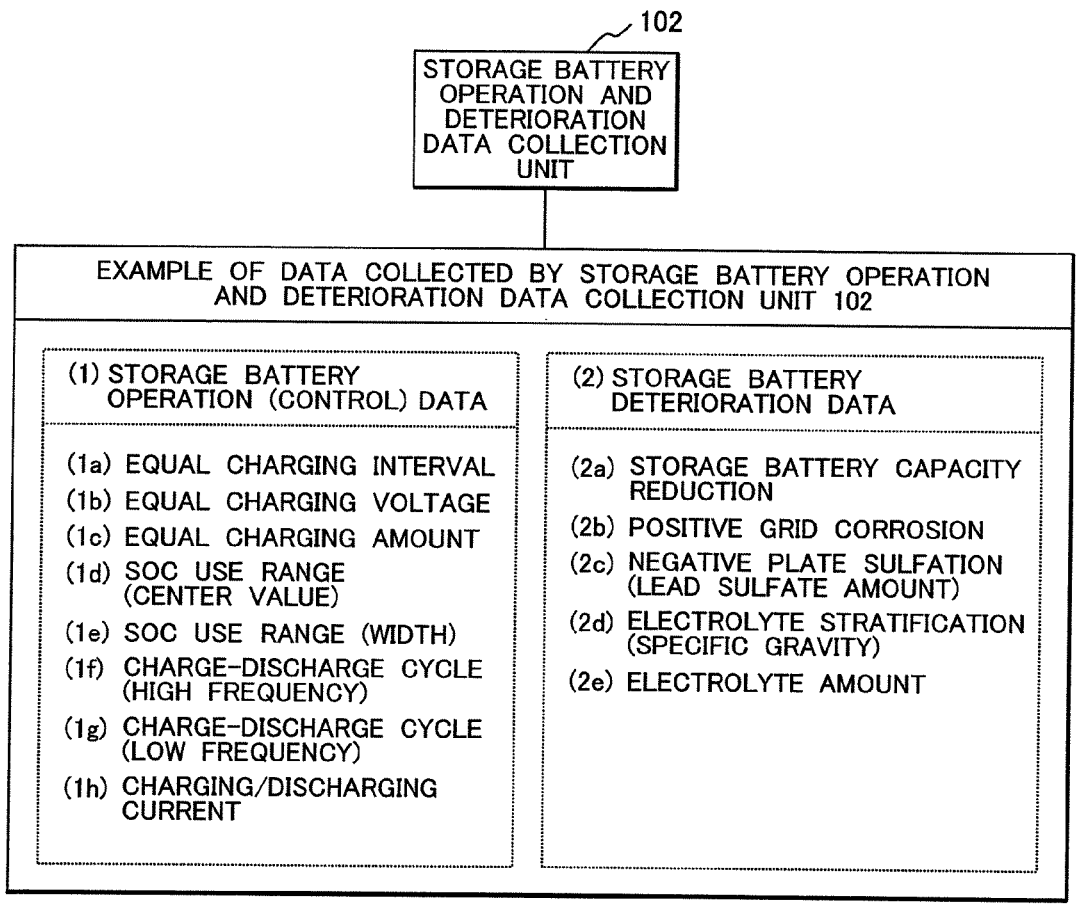
[FIG. 3] An illustrative view showing data in an storage battery operation and deterioration data collection unit.

Next, the operation and content of each of the functional blocks will be described in detail. The storage battery operation and deterioration data collection unit 102 includes various sensors, a memory device, a communication device, and the like, and collects data related to the operation and deterioration of the lead acid storage battery. An example of the data collected by the storage battery operation and deterioration data collection unit 102 is shown in FIG. 3. The storage battery operation and deterioration data collection unit 102 collects data such as the operation data (controllable data) of the storage battery and storage battery deterioration data.

Examples of the operation data (controllable data) of the storage battery that can be shown include: (1a) Equal Charging Interval; (1b) Equal Charging Voltage; (1c) Equal Charging Amount; (1d) SOC Use Range (Center Value); (1e) SOC Use Range (Width), (1f) Charge-Discharge Cycle (High Frequency); (1g) Charge-Discharge Cycle (Low Frequency); and (1h) Charging/Discharging Current. Here, the charge-discharge cycle indicates a time interval between charging and discharging. For example, as (1f) Charge-Discharge Cycle (High Frequency), there can be considered a cycle having a short charge-discharge time interval (of, e.g., several seconds to several minutes) and, as (1g) Charge-Discharge Cycle (Low Frequency), there can be considered a cycle having a long charge-discharge time interval (of, .e.g., several hours to several tens of hours).

Examples of the storage battery deterioration data that can be shown include (2a) Storage Battery Capacity Reduction, (2b) Positive Grid Corrosion, (2c) Negative Plate Sulfation (Lead Acid Sulfate Amount), (2d) Electrolyte Stratification (Specific Gravity), and (2e) Electrolyte Amount.

(Storage Battery Operation and Deterioration Relation Assessment Unit)

The storage battery operation and deterioration data collection unit 102 collects data as mentioned above, and transmits the collected data via the network to the storage battery operation and deterioration relation assessment unit 103.

Figure 4:
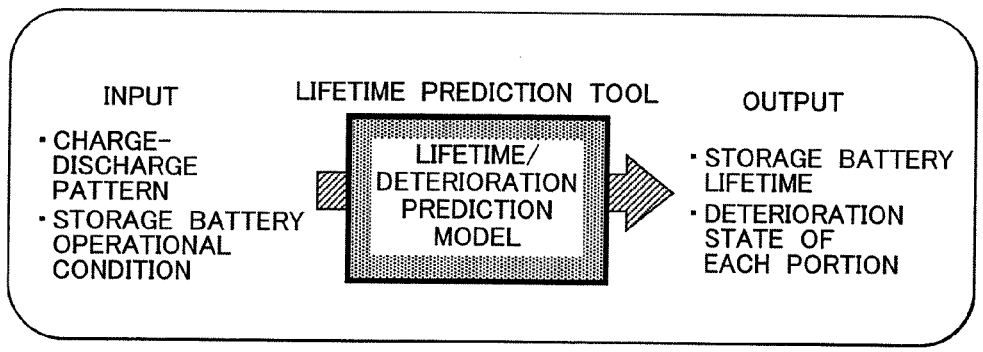
[FIG. 4] A schematic diagram showing a lifetime prediction tool of the present invention.

The storage battery operation and deterioration relation assessment unit 103 forms a part of a lifetime prediction tool (lifetime/deterioration analysis model) as shown in the schematic diagram of FIG. 4, and the content thereof is updated as needed in accordance with data inputted thereto. The lifetime prediction tool is comprised of computer hardware and a software program. When operational conditions for the storage battery including the charge-discharge pattern of the lead acid storage battery or the like are given thereto, the lifetime prediction tool predicts the lifetime of the lead acid storage battery, the deterioration state of each of the portions thereof, and the like through predetermined arithmetic processing, and outputs the lifetime, the deterioration state, and the like. The present invention has a configuration of the lifetime prediction tool (lifetime/deterioration prediction model) as a main portion thereof.

Figure 5:
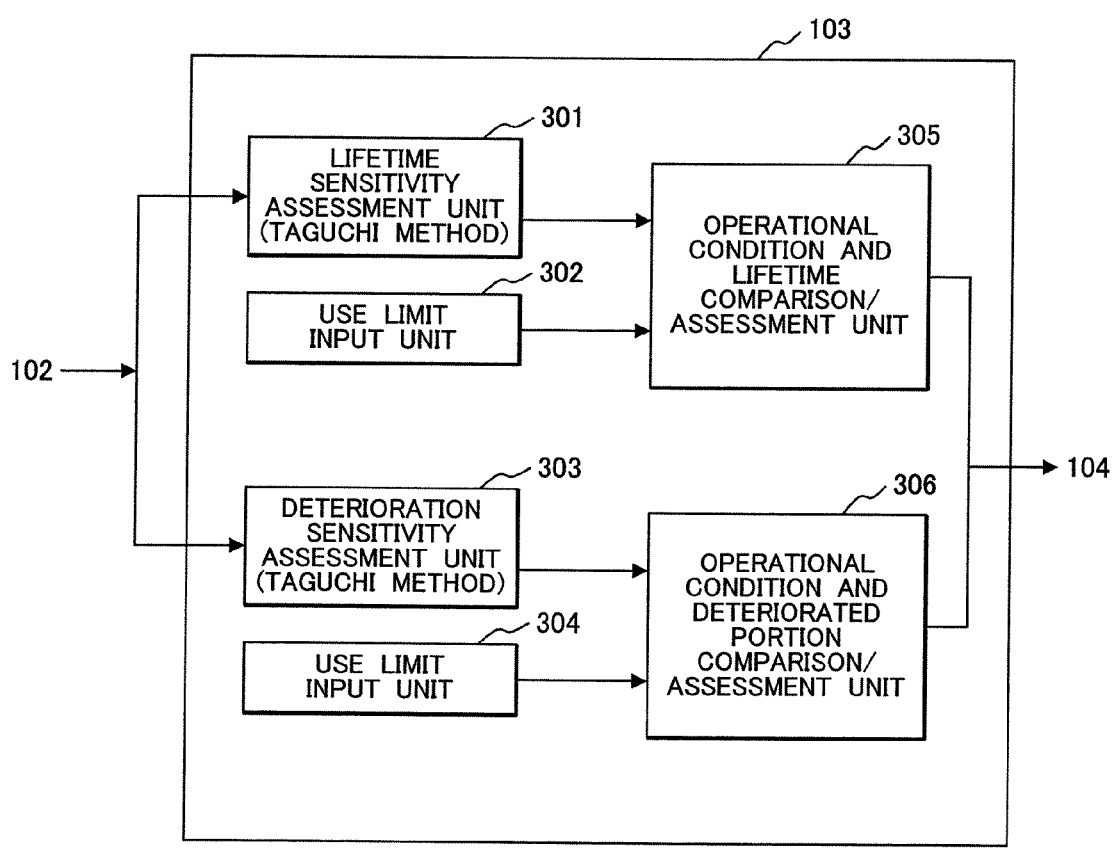
[FIG. 5] A functional block diagram showing a configuration of an storage battery operation and deterioration relation assessment unit.

A configuration of the storage battery operation and deterioration relation assessment unit 103 will be described below using the functional block diagram of FIG. 5. In FIG. 5, a lifetime sensitivity assessment unit 301 calculates, from the data from the storage battery operation and deterioration data collection unit 102, the sensitivity of each of the operational conditions to the lifetime of the lead acid storage battery using a Taguchi method technique. In addition, the limit value of each of use conditions is inputted thereto from a use limit input unit 302. An operational condition and storage battery lifetime comparison/assessment unit 305 compares and assesses the data items, determines the relations between the individual data items, and outputs the determined relations to the storage battery operation planning unit 104. The storage battery operation planning unit 104 calculates, based on the output of the storage battery operation and deterioration relation assessment unit 103, a lifetime in accordance with the input of the use conditions desired by a client and a lifetime under optimum conditions.

A deterioration sensitivity assessment unit 303 calculates, from the data from the storage battery operation and deterioration data collection unit 102, the sensitivity of each of the operational conditions to a deterioration portion of the lead acid storage battery using the Taguchi method technique. In addition, the limit value of each of the use conditions is inputted thereto from a use limit input unit 304. An operational condition and deteriorated portion comparison/assessment unit 306 compares and assesses the data items, determines the relations between the individual data items, and outputs the determined relations to the storage battery operation planning unit 104. The storage battery operation planning unit 104 calculates, based on the output of the storage battery operation and deterioration relation assessment unit 103, a use limit in accordance with the input of the use conditions desired by the client and optimum use conditions, and displays the result of calculation.

Figure 6:
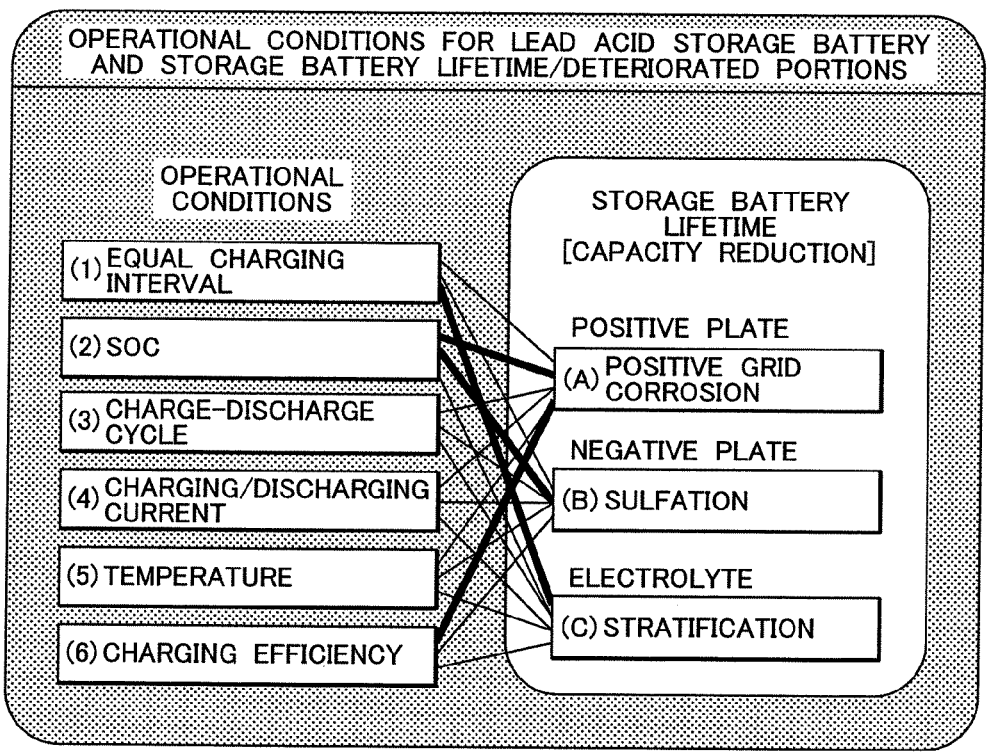
[FIG. 6] An illustrative view showing the relations between operational conditions for a lead acid storage battery and an storage battery lifetime/deteriorated portions.

FIG. 6 is an illustrative view showing the relations between the operational conditions for the lead acid storage battery and an storage battery lifetime/deteriorated portions. As examples of those of the operational conditions for the lead acid storage battery which are controllable and considered to affect the lifetime and deterioration, the following items (1) to (6) can be shown.

(1) Equal Charging Interval: interval between equal chargings for regularly achieving full-charged state (2) SOC (State of Charge): charge level of lead acid storage battery (3) Charge-Discharge Cycle: cycle (period) of charging and discharging (time interval between charging and discharging)

(4) Charging/Discharging Current: magnitude of current upon charging/discharging (5) Temperature: temperature at place where storage battery is disposed.

(6) Charging Efficiency: efficiency during charging, which is parameter used when SOC is estimated. Representative examples of deteriorated portions/deterioration phenomenon of lead acid storage battery that can be shown include following items (A) to (C).

(A) Positive Grid Corrosion: grid of positive plate corrodes due to oxidation.

(B) Negative Plate Sulfation: lead acid sulfate of negative plate is crystallized, and no more ionized to hinder storage battery function.

(C) Electrolyte Stratification: specific gravity of electrolyte is biased to hinder storage battery function.

The currently known relations between (tendencies of) the operational conditions (1) to (6) and the deteriorated portions/deterioration phenomenon (A) to (C), each described above, are shown below.

(1) Equal Charging Interval: if full-charged state is regularly achieved, (B) Negative Plate Sulfation, which tends to occur when storage battery is used in partial state of charge (PSOC) for long period and (C) Electrolyte Stratification can be reduced to allow lifetime of lead acid storage battery to be increased.

(2) SOC: if SOC level is high and results in overcharge, (A) Positive Grid Corrosion advances. Conversely, if SOC level is low, (B) Negative Plate Sulfation is more likely to occur.

(3) Charge-Discharge Cycle: in general, when the number of the cycles of charging and discharging is large, deterioration advances (influence of short-cycle charging and discharging such as for wind power generated electricity output may be different therefrom).

(4) Charging/Discharging Current: if magnitude of current upon charging/discharging is excessively large, temperature in storage battery rises due to heat generation in storage battery to accelerate positive grid corrosion. This also causes moisture evaporation (electrolyte reduction) to possibly cause capacity reduction earlier than usual.

(5) Temperature: when temperature at place where storage battery is disposed is high, positive grid corrosion tends to be accelerated.

(6) Charging Efficiency: efficiency parameter during charging which is used when SOC is estimated. If charging efficiency is different from actual charging efficiency, estimated SOC errors are accumulated and result in overcharge to possibly advance (A) Positive Grid Corrosion.

The foregoing is the conventionally known tendencies toward the deterioration and lifetime. To precisely predict the lifetime of the wind power generation and storage battery system, it is necessary to quantitatively model the relations between operational conditions (operational conditions which are controllable while satisfying a requirement of interconnected system in an electric power company) how the lifetime and deterioration advance depending on a combination of the operational conditions.

(Lifetime/Deterioration Prediction Model)

Figure 7:
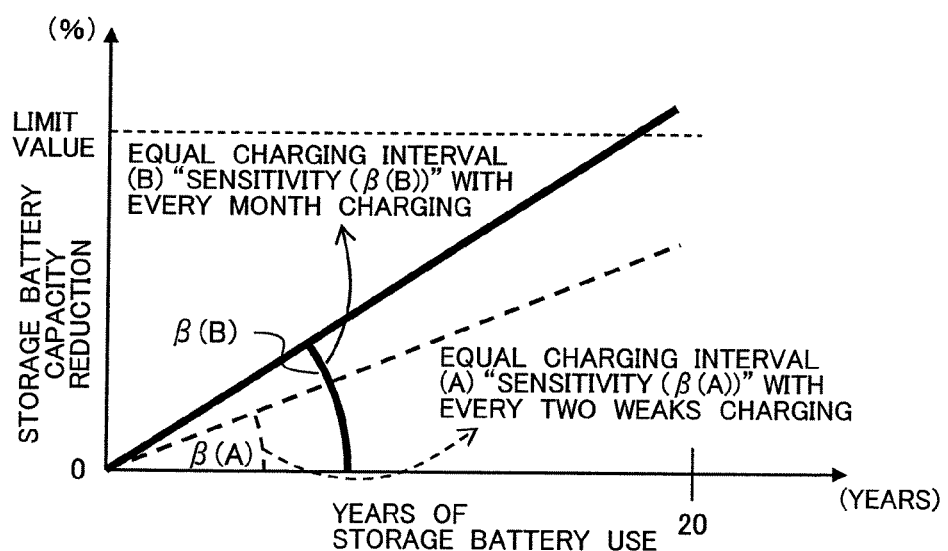
[FIG. 7] An illustrative view showing a lifetime prediction method according to a Taguchi method.

A description will be given of a modeling technique using a Taguchi method (dynamic characteristics) for constructing a prediction model concerning the relations between the operational conditions for the storage battery and the lifetime and deterioration of the storage battery. As mentioned above, there are various operational conditions related to the deterioration of the storage battery. In addition, there can be considered an enormous number of combinations of the conditions. Therefore, due to the constraints of cost and a time period, it is difficult to perform experiment and measurement in regard to how the lifetime and deterioration advance under each of the combinations of the conditions. However, by using a Taguchi method technique and an L18 experiment planning technique, the relations between the operational conditions related to the deterioration of the storage battery and the lifetime and deterioration can be determined by experiment within the actual range of the number of combinations. FIG. 7 shows a illustrative view of a lifetime prediction model using the dynamic characteristics of the Taguchi method.

By performing the factor analysis of the Taguchi method and determining "Sensitivity", it is possible to independently examine the degree of influence of each of the operational conditions in complicated combinations thereof on the lifetime (Here, the operational conditions correspond to the "control factors" of the Taguchi method).

FIG. 7 is an illustrative view showing a lifetime prediction technique according to the Taguchi method. In FIG. 7, using the Taguchi method (dynamic characteristics), the relation between "Years" and "Storage battery Capacity Reduction" of each of the control factors (expressed as "Sensitivity") is defined. For example, in the example of FIG. 7, a description will be given of the case where a comparison is made between respective sensitivities when the operational condition "Equal Charging Interval" is (A) "Every Two Weeks" and (B) "Every Month".

It is assumed that, when the comparison is made with the control factors (A) and (B), the sensitivities ($\beta(A)$ and $\beta(B)$) of outputs (storage battery capacity reductions) to input (years of storage battery use) are compared and, the ratio ($\beta(B)/\beta(A)$)=1.5 is obtained. In this case, the degree of influence given by the equal charging interval on the lifetime is 1.5 times larger with (B) than with (A). It can be seen that, when charging is performed at equal charging interval of "Every Month", deterioration advances 1.5 times faster than when charging is performed at equal charging interval of "Every Two Weeks".

Figure 8:
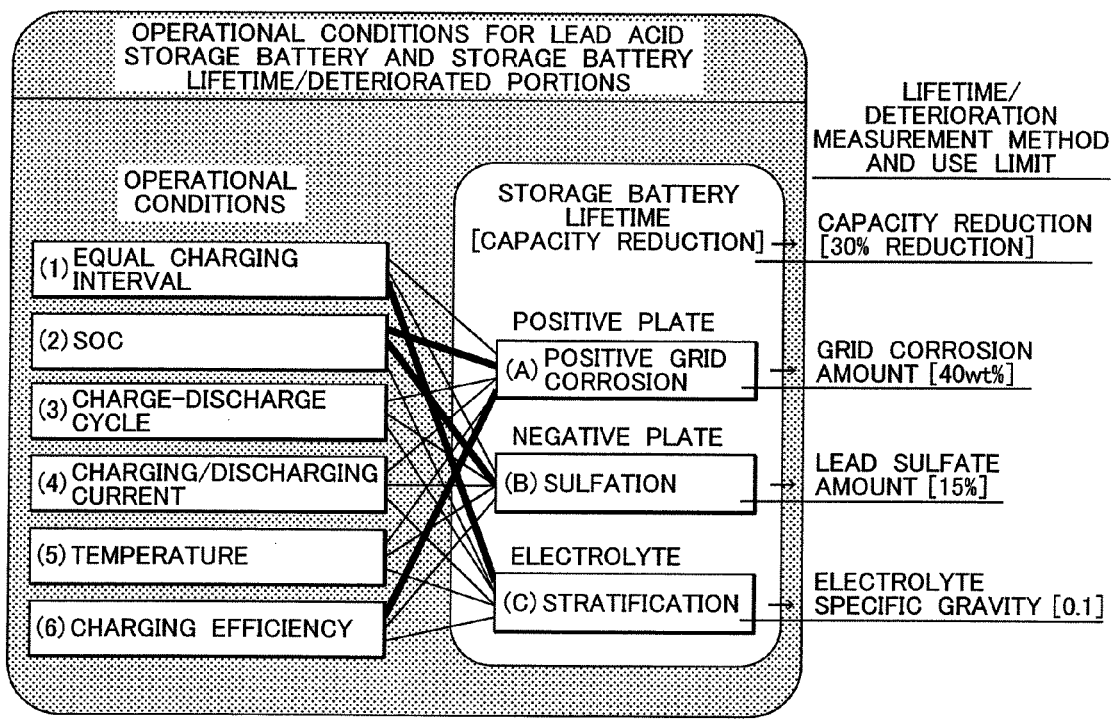
[FIG. 8] An illustrative view showing the relations between the operational conditions for the lead acid storage battery and the storage battery lifetime/deteriorated portions.

For the deterioration of each of the portions of the lead acid storage battery also, a deterioration prediction model can be constructed in the same manner as for the lifetime (capacity reduction) of the lead acid storage battery. FIG. 8 shows a method of measuring the lifetime of the storage battery and the deterioration of each of the portions thereof, and an example of a limit value that can be used.

It is assumed that the lifetime of the lead acid storage battery reaches the use limit at the time when the capacity thereof undergoes a 30% reduction. Likewise, the degree of deterioration advancement of each of the portions is measured by measuring the values shown below, and it is assumed that the use limit is reached when predetermined reference values are reached.

(A) Positive Grid Corrosion . . . Measurement Value: Grid Corrosion Amount, Use Limit: 40 wt %

(B) Negative Plate Sulfation . . . Measurement Value: Lead acid Sulfate Amount, Use Limit: 15%

(C) Electrolyte Stratification . . . Measurement Value: Electrolyte Specific Gravity, Use Limit: 0.1

In the same manner as described in the previous section, to examine the relations between the various operational conditions related to deterioration and the deterioration of each of the portions, the sensitivity of each of the factors is determined using the factor analysis of the Taguchi method. As a result, it is possible to independently examine the degree of influence of each of the operational conditions (control factors) in complicated combinations thereof on the deterioration of each of the portions.

Figure 9A:
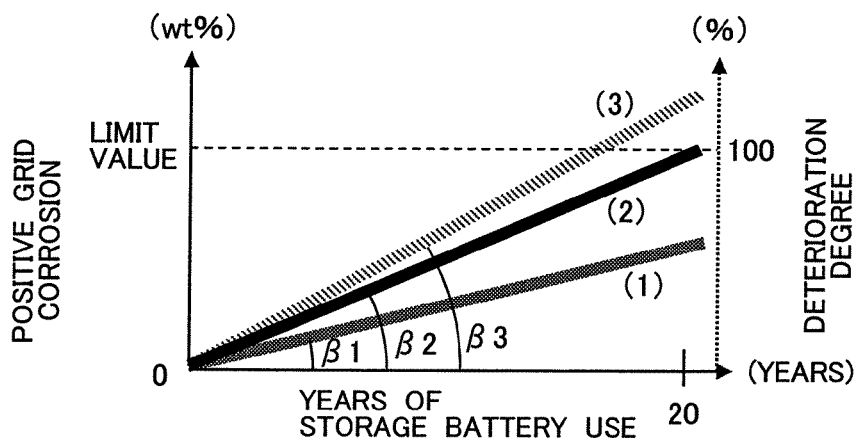
[FIG. 9A] An illustrative view showing an example of lifetime prediction at each of levels according to the Taguchi method.
Figure 9B:
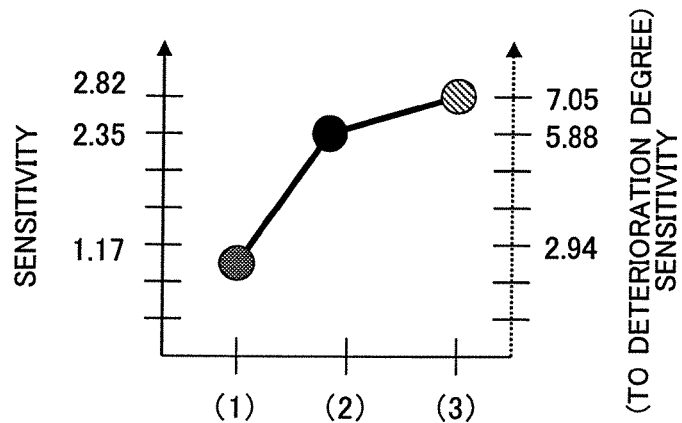
[FIG. 9B] An illustrative view showing an example of the lifetime prediction at each of the levels according to the Taguchi method.
Figure 10A:
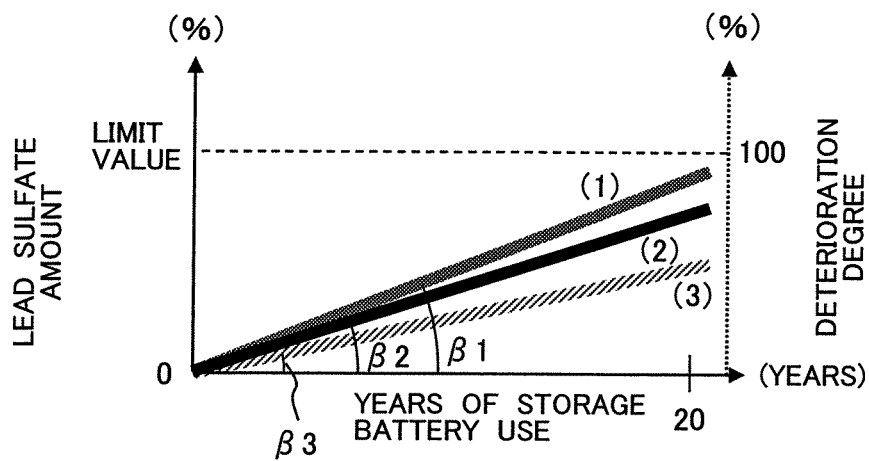
[FIG. 10A] An illustrative view showing an example of the lifetime prediction at each of the levels according to the Taguchi method.
Figure 10B:
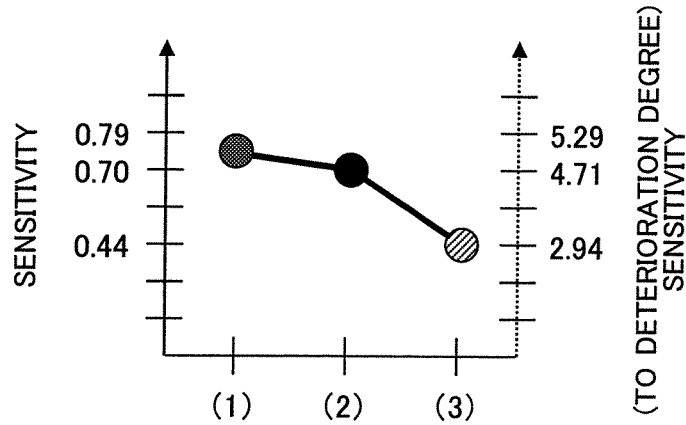
[FIG. 10B] An illustrative view showing an example of lifetime prediction for each of the levels according to the Taguchi method.

FIGS. 9A and 9B are illustrative views each showing an example of examining the influence of the use range of SOC on (A) Positive Grid Corrosion. FIG. 9A shows positive grid corrosion against years of storage battery use, and FIG. 9B shows a sensitivity at each of levels. FIGS. 10A and 10B are illustrative views each showing an example of examining the influence of the use range of SOC on (B) Negative Plate Sulfation. FIG. 10A shows a lead acid sulfate amount against years of storage battery use, and FIG. 10B shows a sensitivity at each of the levels. In the examples of FIGS. 9A to 10B, it is assumed that the SOC use range is set to the following levels (1) to (3) including a current standard use range (30% to 80%) and values upwardly and downwardly varied therefrom.

(1) 20% to 70%
(2) 30% to 80%
(3) 40% to 90%

In general, it is said that, as SOC is higher, influence which tends to accelerate "(A) Positive Grid Corrosion" is more likely to arise and, as SOC is lower, influence which tends to accelerate "(B) Negative Plate Sulfation" is more likely to arise. Nonetheless, it is assumed that, as a result of performing experiments at the foregoing levels (1) to (3), and performing the factor analysis of the Taguchi method, the sensitivities are in a relation as shown in FIG. 9B. That is, it is assumed that, in the case of the current standard use range (2), as shown in FIG. 9A, the advancement of "(A) Positive Grid Corrosion" is on the verge of allowing the targeted years to be achieved or not but, when the use range is reduced to (1), the advancement of "(A) Positive Grid Corrosion" dramatically slows down (increases lifetime). On the other hand, it is assumed that, as shown in FIG. 10A, even when the use range is reduced from the current SOC use range (2) to (1) for (B) Negative Plate Sulfation, the advancement of deterioration is not significantly accelerated, and the targeted years can be achieved. It can be seen that, in that case, the lifetime can be made longer by setting the SOC use range of the wind power generation storage battery to (1).

An example of obtaining data for performing prediction by such a Taguchi method (dynamic characteristics) by planning an L18 experiment is shown. FIG. 11 shows an example of setting control factors and level values for the L18 experiment. Here, as the control factors that determine the lifetime in the lead acid storage battery, (a) Equal Charging Interval, (b) SOC Use Range (Center Value), (c) SOC Use Range (Width), (d) Charge-Discharge Cycle (High-Frequency), (e) Charge-Discharge Cycle (Low-Frequency), (f) Charging/Discharging Current, (g) Temperature, and (h) Charging Efficiency are used by way of example. Note that, depending on the type and characteristics of the lead acid storage battery, using the control factors affecting the lifetime, an experiment plan can be made. FIG. 12 shows an example of an L18 orthogonal array table. By performing experiment with a combination using the L18 orthogonal array table, and performing factor analysis on the obtained data by the Taguchi method (dynamic characteristics) to determine the sensitivity thereof, it is possible to estimate how many years the lifetime is when the operation of the lead acid storage battery is changed. Thus, by using lifetime prediction according to the Taguchi method (dynamic characteristics), the storage battery operation and deterioration relation assessment unit 103 can be constructed.

Note that the details of the factor analysis of the Taguchi method (dynamic characteristics) are introduced in books such as "Genichiro Taguchi, Functional Evaluation for Robust Design Methods for Efficient Development, Japanese Standards Association (2000 June)", "Hiroshi Yano, Guide to Quality Engineering: New Way of Thinking for Changing Technology, Japanese Standards Association (1995 August)", "Genichiro Taguchi and Yoshiko Yokoyama, Door to Basic Quality Engineering, Japanese Standards Association (2007 September)", "Genichiro Taguchi and Yoshiko Yokoyama, Off-Line Quality Engineering, Japanese Standards Association (2007 May)", and "Taichiro Ueda, Taguchi Method (Quality Engineering) Calculation Method Using Excel, Techno Consultants Inc.".

(Lifetime Prediction Tool)

Figure 14:
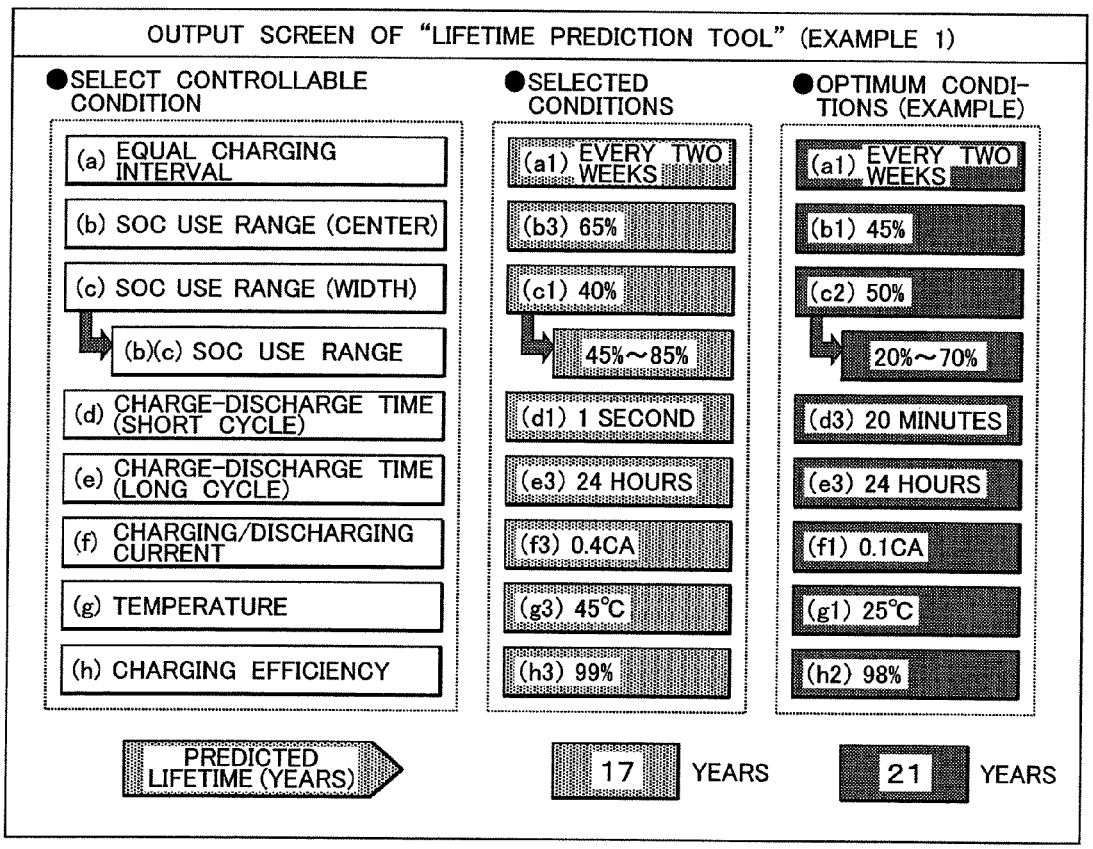
[FIG. 14] A schematic diagram showing a screen of the lifetime prediction tool according to the Taguchi method.
Figure 15:
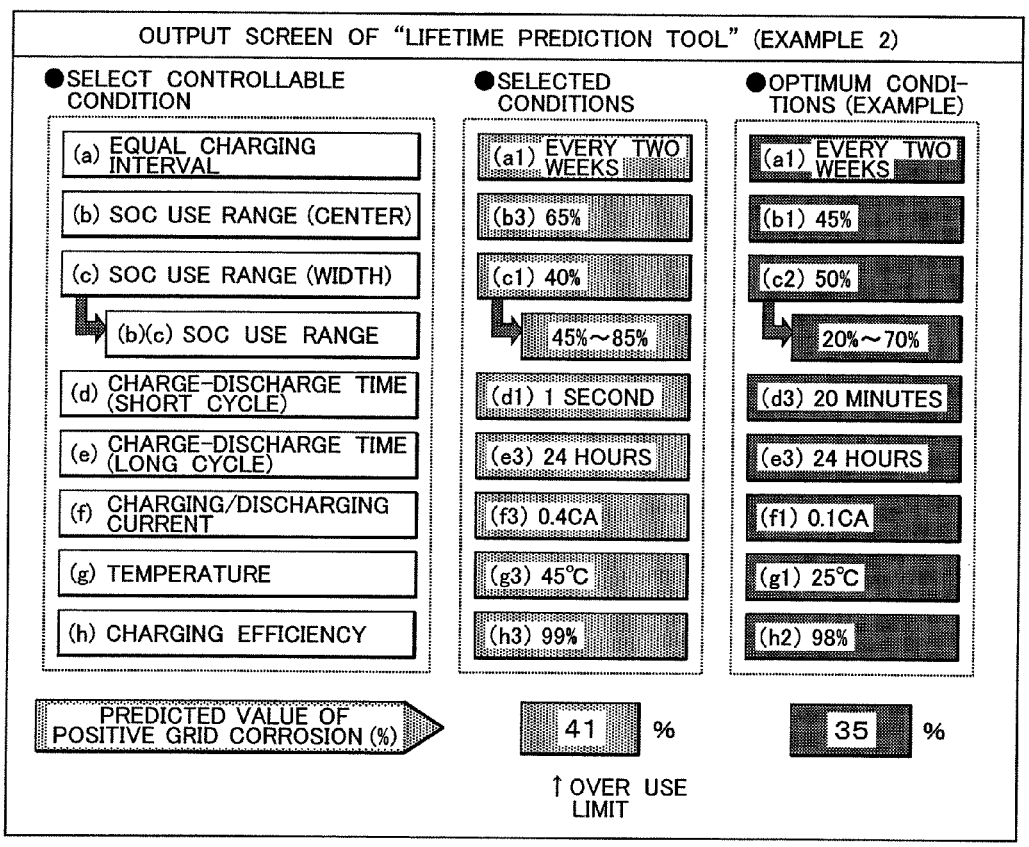
[FIG. 15] A schematic diagram showing a screen of the lifetime prediction tool according to the Taguchi method.

FIGS. 13 to 15 show examples of an interface screen in a computer system which allows a user to easily recognize the result of predicting the lifetime/deterioration of a lead acid storage battery with a lifetime prediction tool using the Taguchi method (dynamic characteristics). FIG. 13 shows an input (menu selection) screen of the lifetime prediction tool. Using "Select Controllable Condition" menu buttons displayed on the left part of the screen, it is possible to specify operational conditions for the lead acid storage battery, and assess the lifetime and deterioration of the lead acid storage battery under the specified conditions. The operational conditions are control factors (a to h), and experiment levels (a: two levels, and b to h: three levels) for the lead acid storage battery for wind power generation are displayed as a pull-down menu to allow the user to specify the operational conditions by combining the experiment levels therewith.

After selecting the operational conditions desired to be assessed using the menu buttons on the left part of the screen, the user selects assessment execute buttons on the right part thereof. When the user presses the lifetime predict button displayed in the "Predict Lifetime" section on the upper right part, the lifetime prediction tool determines, by arithmetic processing, years until the lead acid storage battery reaches the lifetime and years until the deterioration (use limit) of each of the portions (until the use limit thereof is reached) under the operational conditions selected in the menu on the left part, and under optimum operational conditions, and then displays the determined years.

When the user presses any of the buttons displayed in the Predict "Capacity/Deterioration Degree" from "Years of Use" section on the lower right part, the lifetime prediction tool determines the capacities of the lead acid storage battery and the deterioration degrees of each of the portions thereof when specified years elapse under the operational conditions selected in the menu in the left part and under the optimum operational conditions, and displays the determined capacities and deterioration degrees.

FIG. 14 shows Example 1 of an output screen displayed when the user presses the "Predict Lifetime" button in the upper right section. In the example of FIG. 14 is shown the result of assessing, as a result of pressing the "Predict Lifetime" button, years until "Capacity Reduction of Lead Acid Storage Battery Reaches 30%" corresponding to the lifetime (use limit) of the lead acid storage battery.

At the center in the lower section of the screen of the lifetime prediction tool, the result of prediction using the operational conditions selected by the user in the menu is displayed, in which the lifetime of the lead acid storage battery is 17 years. The lifetime prediction tool is also allowed to automatically determine "optimum operational conditions" and a "lifetime" when an optimum operation is performed. In the example of the drawing, the optimum operational conditions determined by the lifetime prediction tool are displayed in the right part of the lower section of the screen, and it can be seen that the predicted lifetime in the case where the optimum operation is performed is 21 years.

FIG. 15 shows Example 2 of a screen displaying the result of prediction when the user presses any of the buttons in the Predict "Capacity/Deterioration Degree" from "Years of Use" section on the lower right part of FIG. 13, and specified years have elapsed. In the lower section of the screen of FIG. 15, an example of predicting positive grid corrosion after 21 years of use is displayed.

The operational conditions selected by the user in the menu are displayed again in the center section of the screen of the lifetime prediction tool. The amount of positive grid corrosion when 21 years have elapsed in accordance with the operation method is 41%, and a message reporting "Over Use Limit" is displayed. That is, by specifying an operation method and targeted years and performing assessment, it can be predicted whether or not a target can be achieved by such an operation.

The present lifetime prediction tool is also allowed to automatically determine "optimum operational conditions" and a "state of deterioration when the optimum operation has been performed, and specified years have elapsed". In the example of the drawing, the optimum operational conditions determined by the lifetime prediction tool are shown in the right part. It is predicted that, in the case of performing the optimum operation, a predicted value of the amount of positive grid corrosion when 21 years have elapsed is 35%. In this case (case of the operation under the optimum operational conditions), even when 21 years have elapsed, the use limit for positive grid corrosion has not been reached. Therefore, it is predicted that, if such control as to allow the lead acid storage battery to be used under operational conditions as determined by the lifetime prediction tool can be performed, positive grid corrosion is in a state which allows the storage battery to be used even when targeted 21 years have elapsed.

Thus, by using this lifetime prediction tool, it is possible to predict the lifetime of the lead acid storage battery and years until the deterioration (use limit) of each of the portions thereof under various operational conditions. In addition, it is possible to predict the degree of capacity reduction of the storage battery, the state of deterioration advancement of each of the portions thereof, and the like when specified years have elapsed. It is also possible to cause the lifetime prediction tool to automatically determine optimum operational conditions without an operation by the user. These outputs are transmitted to an electricity generation site using a network, and used for the optimum operation of the wind power generation and storage battery system 101.

Figure 16:
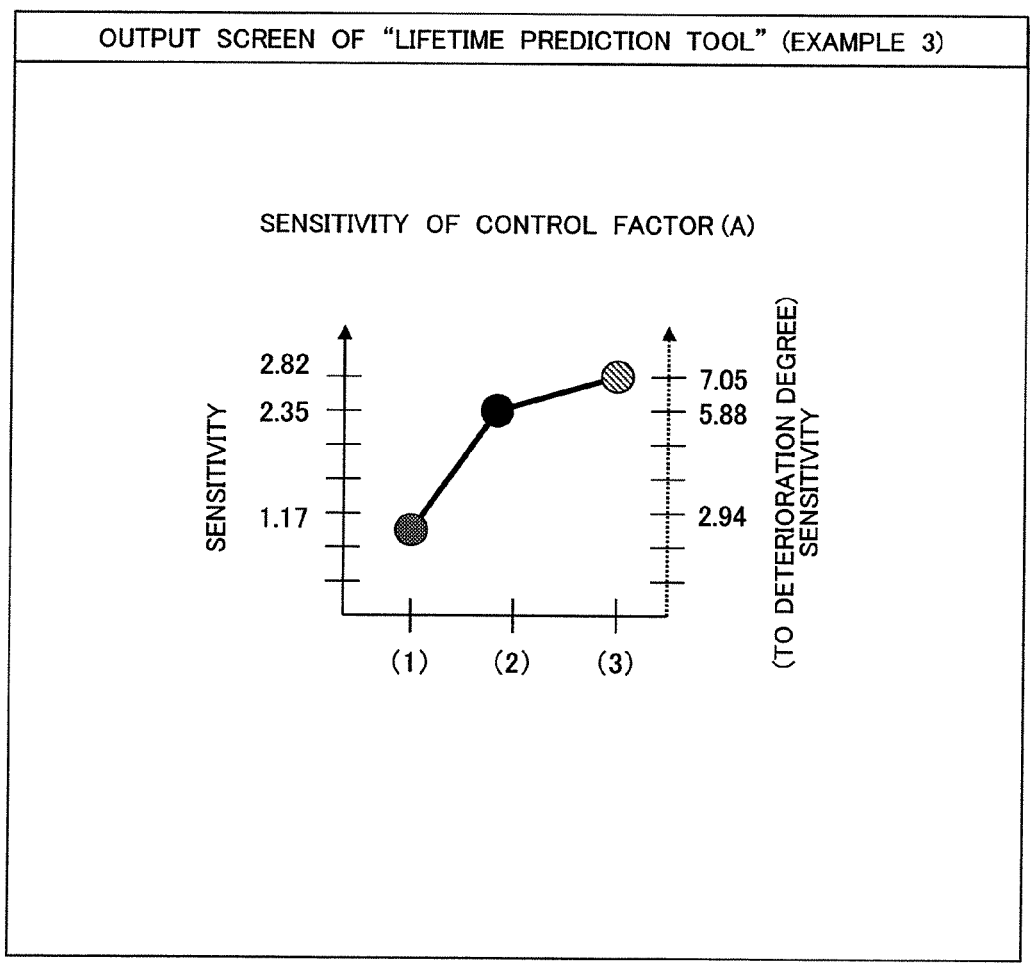
[FIG. 16] A schematic diagram showing a sensitivity displaying screen of the lifetime prediction tool according to the Taguchi method.

FIG. 16 shows Example 3 of a screen displaying the result of causing this lifetime prediction tool to automatically perform factor analysis on data collected by this lifetime prediction tool through experiment. FIG. 16 shows a graph showing a factor effect (sensitivity) for each of the control factors (operational conditions). The graph is displayed to allow easy visual recognition of the levels of sensitivities at the three levels (only A has two levels). In regard to the lifetime/deterioration prediction, a lower sensitivity results in an operation method in which the lifetime and deterioration are less likely to advance, and the lifetime is longer.

This lifetime prediction tool is characterized in that, when data collected by experiment is given thereto, this lifetime prediction tool can automatically perform the factor analysis of the Taguchi method and construct a prediction model and, as a larger amount of data is given, the accuracy of prediction improves. As a result, it is possible to regularly collect data based on the L18 experiment plan produced for the lead acid storage battery for wind power, and improve the accuracy of prediction. In addition, using the lifetime prediction tool described above, control which satisfies a required lifetime can be planned.

[Embodiment 2]

Figure 17:
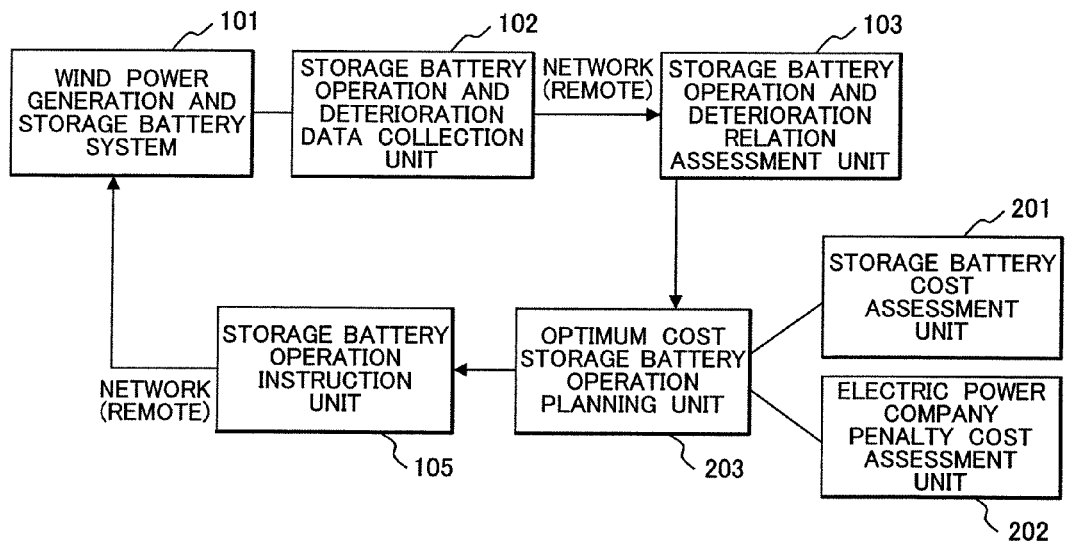
[FIG. 17] A functional block diagram showing Embodiment 2 of the present invention.
Figure 18:
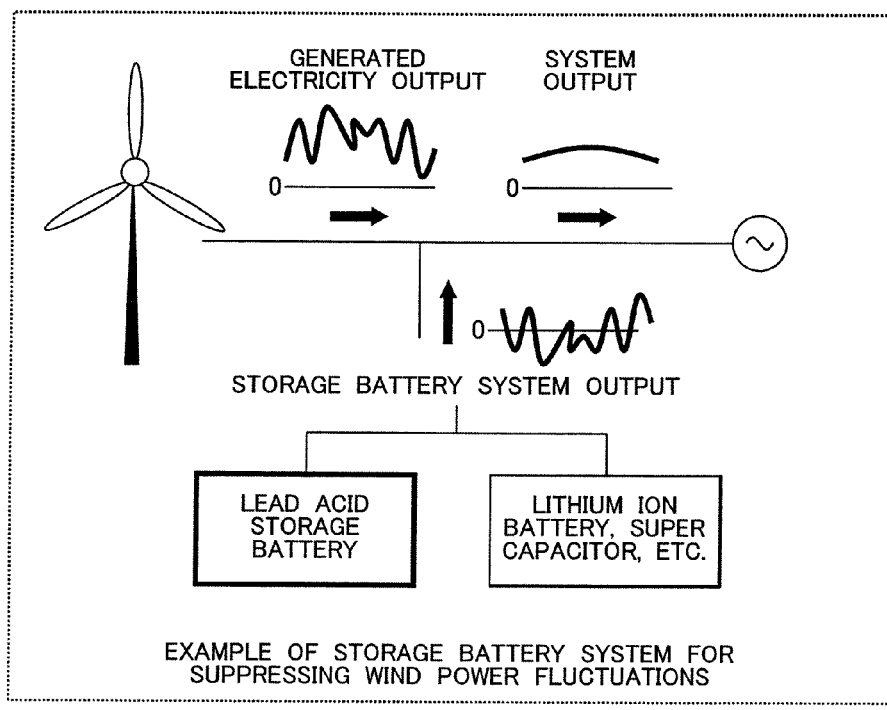
[FIG. 18] A schematic diagram of a conventional wind power generation and storage battery system.
Figure 19:
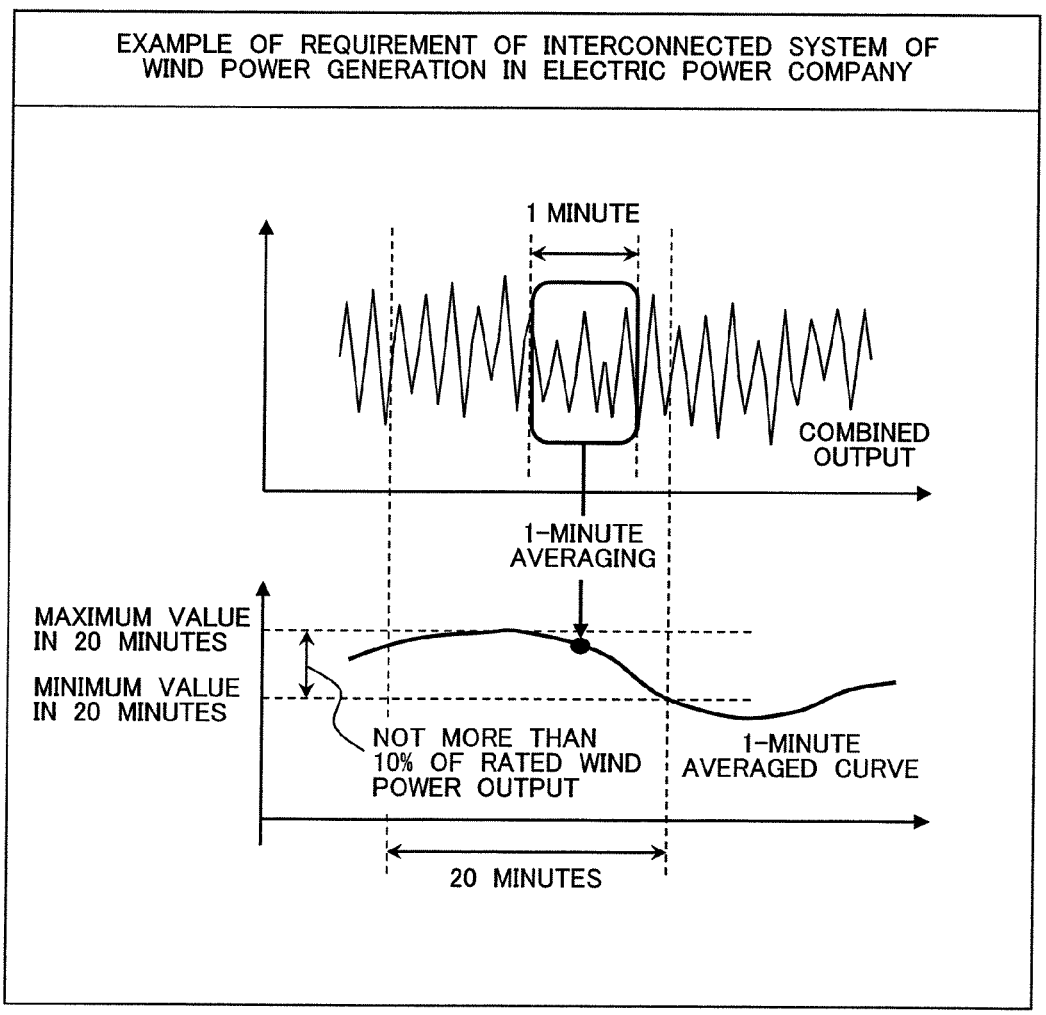
[FIG. 19] A schematic diagram of a requirement of interconnected system of conventional wind power generation in an electric power company.

In Embodiment 2 of the present invention, as shown in the functional block diagram of FIG. 17, instead of the storage battery operation planning unit 104 for planning a method of operating the lead acid storage battery of Embodiment 1, there are provided an storage battery cost assessment unit 201 for assessing information on the cost of the lead acid storage battery, an electric power company penalty cost assessment unit 202 for assessing cost including interconnected system penalty cost paid to an electric power company and a profit obtained by selling wind power generated electricity, and an optimum cost storage battery operation planning unit 203 for planning a cost optimum operation of the lead acid storage battery from the information from the storage battery operation and deterioration relation assessment unit 103, the information from the storage battery cost assessment unit 201, and the information from the electric power company cost assessment unit 202.

The cost information of the lead acid storage battery assessed by the storage battery cost assessment unit 201 includes an storage battery initial purchase expense, a maintenance expense, an storage battery replacement expense, and the like. The electric power company cost assessed by the electric power company cost assessment unit 202 includes wind power generated electricity purchase cost (profit) (which may be different depending on electric power quality), a delivery charge, penalty cost when requirement of interconnected system is violated, and the like. The operation method may be planned appropriately so as to maximize such cost related to the lead acid storage battery and cost (profit) related to the electric power company. In this manner, Embodiment 2 of the present invention can be implemented.

Thus, according to Embodiment 2, even when the level of the purchase price of wind power generated electric power changes in future depending on the quality of electric power generated by wind power, whether or not electricity has been generated in an exactly announced amount, or the like, system control can be performed which allows optimum profit, including also the price difference therebetween, to be obtained.

EXPLANATIONS OF LETTERS AND NUMERALS

101: Wind Power Generation and Storage Battery System
102: Storage Battery Operation and Deterioration Data Collection Unit
103: Storage battery Operation and Deterioration Relation Assessment Unit
104: Storage Battery Operation Planning Unit
105: Storage Battery Operation Instruction Unit
106: Semiconductor Chip
201: Storage Battery Cost Assessment Unit
202: Electric Power Company Penalty Cost Assessment Unit
203: Optimum Cost Storage Battery Operation Planning Unit

The invention claimed is:

1. A system for control of a wind power generation storage battery, comprising:
a wind power generation and storage battery system, including a storage battery;
a storage battery operation data and deterioration data collection unit, configured to collect operation data and deterioration data pertaining to the storage battery in the wind power generation and storage battery system;
a storage battery operation and deterioration relationship assessment unit, configured to assess a relationship between an operation of the storage battery and a lifetime and deterioration thereof, based on the operation data and deterioration data collected by the storage battery operation data and deterioration data collection unit;
a storage battery operation planning unit, configured to create a plan for operating the wind power generation and storage battery, wherein the plan satisfies a necessary lifetime requirement, based on information obtained by the storage battery operation and deterioration relationship assessment unit; and
a storage battery operation instruction unit, configured to instruct the operation of the storage battery in the wind power generation and storage battery system, in accordance with the plan created by the storage battery operation planning unit;
wherein the storage battery operation data and deterioration data collection unit collects at least one of the following as storage battery deterioration data: storage battery capacity reduction data, positive grid corrosion data, negative plate sulfation data, electrolyte stratification data, and an electrolyte amount data;
wherein the storage battery operation data and deterioration data collection unit collects at least one of the following as storage battery operation data: equal charging interval data, equal charging voltage data, equal charging amount data, State of Charge (SOC) use range data, charge-discharge cycle data, and charging/discharging current data;
wherein the storage battery operation and deterioration relationship assessment unit includes: a deterioration sensitivity assessment unit, a use limit input unit, and an operation condition and deteriorated portion comparison and assessment unit;
wherein the deterioration sensitivity assessment unit calculates a sensitivity to a deteriorated portion of the storage battery, from the storage battery deterioration data and the storage battery operation data, by using a Taguchi method technique;
wherein the operation condition and deteriorated portion comparison and assessment unit calculates comparison and assessment data, based on a sensitivity, and based on a limit value of use conditions input from a use limit input unit; and
wherein the storage battery operation planning unit plans an operation method based on the comparison and assessment data, such that the storage battery satisfies the necessary lifetime requirement.

2. A system for control of a wind power generation storage battery according to claim 1,
   wherein a warning is displayed on a display, when limit values of a storage battery lifetime and a deteriorated portion met, including: a storage battery capacity reduction of not more than minus 30%, a positive grid corrosion amount of not more than 40 weight percent (wt %), a lead acid sulfate amount of not more than 15% in negative plate sulfation, and an electrolyte specific gravity difference of not more than 0.1 in electrolyte stratification, each compared with a rating of the storage battery.

3. A system for control of a wind power generation storage battery according to claim 2, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

4. A system for control of a wind power generation storage battery according to claim 1, wherein a lead acid storage battery is used as the storage battery.

5. A system for control of a wind power generation storage battery according to claim 4, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

6. A system for control of a wind power generation storage battery according to claim 1, wherein the storage battery operation data and deterioration data collection unit includes a semiconductor chip disposed in the storage battery.

7. A system for control of a wind power generation storage battery according to claim 6, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

8. A system for control of a wind power generation storage battery according to claim 1,
   wherein the wind power generation and storage battery system, and the storage battery operation data and deterioration data collection unit, are disposed at an electricity generation site; and
   wherein the storage battery operation and deterioration relationship assessment unit, the storage battery operation planning unit, and the storage battery operation instruction unit are disposed at a remote control site coupled via a network to the electricity generation site.

9. A system for control of a wind power generation storage battery according to claim 8, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

10. A system for control of a wind power generation storage battery according to claim 1, wherein the storage battery operation and deterioration relationship assessment unit, the storage battery operation planning unit, and the storage battery operation instruction unit include: a software program operating on a computer.

11. A system for control of a wind power generation storage battery according to claim 10, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

12. A system for control of a wind power generation storage battery according to claim 1, wherein the storage battery operation and deterioration relationship assessment unit, the storage battery operation planning unit, and the storage battery operation instruction unit collectively output: a predicted lifetime calculated based on user selected values of specified conditions, and a predicted lifetime calculated based on optimum values of the specified conditions.

* * * * *